United States Patent [19]
Inbar

[11] Patent Number: 5,838,153
[45] Date of Patent: Nov. 17, 1998

[54] MAGNETIC MEDIA TESTER WHICH INCLUDES A FILTER THAT FILTERS THE PRODUCT OF A READ SIGNAL AND AN OUTPUT OF A PHASE LOCK LOOP CIRCUIT

[75] Inventor: Michael Inbar, Santa Barbara, Calif.

[73] Assignee: Phase Metrics, Inc., San Diego, Calif.

[21] Appl. No.: 766,901

[22] Filed: Dec. 13, 1996

[51] Int. Cl.$^6$ .............................. G01R 33/12; G11B 5/09; G01N 27/72
[52] U.S. Cl. .............................. 324/212; 360/53; 360/31; 369/53
[58] Field of Search ................................ 324/210, 212, 324/211; 371/21.4, 21.5, 21.6; 360/31, 53; 369/53, 58

[56] References Cited

U.S. PATENT DOCUMENTS 5,121,263  6/1992  Kerwin et al. .............................. 360/53

*Primary Examiner*—Walter E. Snow
*Attorney, Agent, or Firm*—Blakely Sokoloff Taylor & Zafman

[57] ABSTRACT

A disk certifier which analyzes a read signal generated from a disk of a hard disk drive. The read signal typically has a sinusoidal waveform with modulated peak amplitudes. The waveform is generally defined by the equation $A \cdot \sin(wt) \cdot (1-m(t))$, where the term $m(t)$ is the amplitude modulation of the signal. The peak signal is provided to a phase lock loop circuit which generates a multiplier peak signal generally of the form $\sin(wt)$. The certifier includes a multiplier which multiplies the read signal by the multiplier read signal to provide a multiplied read signal described by the equation $A/2 \cdot (1-\cos 2(wt)) \cdot (1-m(t))$. The multiplied read signal is filtered by a low pass filter which has a cut-off frequency Wc below w. The low pass filter provides a filtered multiplied read signal which is described by the equation $A \cdot (1-g(t))$, wherein the term $g(t)$ is the portion of $m(t)$ with frequencies below Wc. The filtered multiplied read signal is then compared to a threshold value(s) to determine a pass/fail error condition of the read signal. The certifier also has a histogram circuit which detects, counts and stores the occurrence of each peak amplitude value of the read signal. The peak amplitude data can be processed to plot a histogram which shows how many times the read signal produced various peak amplitudes. The histogram can be used to determine the actual performance of the disk certifier.

14 Claims, 2 Drawing Sheets

MAGNETIC MEDIA TESTER WHICH INCLUDES A FILTER THAT FILTERS THE PRODUCT OF A READ SIGNAL AND AN OUTPUT OF A PHASE LOCK LOOP CIRCUIT

BACKGROUND OF THE INVENTION

1. Field of the Invention

The present invention relates to a test apparatus that measures the magnetic characteristics of a magnetic disk.

2. Description of Related Art

Hard disk drives contain a rotating magnetic disk(s) which stores information. The magnetic fields of the disk are sensed by a transducer located within a slider of the disk drive. To insure compliance with manufacturing specifications the disks are typically tested before being assembled into a disk drive assembly.

The magnetic characteristics of the disks are determined by writing a test pattern onto a disk and then reading the test pattern. The test pattern is typically a sinusoidal waveform. The resulting read signal is analyzed by comparing the peak amplitudes of the sinusoidal waveform with a threshold value. The threshold value is typically a constant k multiplied by the average of a predetermined number of previous peak amplitude values, wherein k is less than 1. An error signal is generated if a peak amplitude falls below the threshold value.

In an effort to improve the storage capacity of disk drives, drive manufacturers are continuously increasing the aerial bit density of the disks. The increased density typically requires higher read signal frequencies which decrease the signal to noise ratio (SNR) of the read signal. The lower signal to noise ratio may produce erroneous pass/fail data during a test routine of the disk. It would be desirable to provide a high frequency disk certifier which minimizes the effects of noise on the read signal generated from the disk.

Disk certifiers of the prior art provide only pass/fail data. There is typically no verification on the performance of the certifier. It would be desirable to provide a disk certifier which generates data that can be analyzed to evaluate the performance of the certifier.

SUMMARY OF THE INVENTION

The present invention is a disk certifier which analyzes a read signal generated from a disk of a hard disk drive. The read signal typically has a sinusoidal waveform with modulated peak amplitudes. The waveform is generally defined by the equation $A \cdot \sin(wt) \cdot (1-m(t))$, where the term $m(t)$ is the amplitude modulation of the signal. The peak signal is provided to a phase lock loop circuit which generates a multiplier peak signal generally of the form $\sin(wt)$. The certifier includes a multiplier which multiplies the read signal by the multiplier read signal to provide a multiplied read signal described by the equation $A/2 \cdot (1-\cos 2(wt))(1-m(t))$. The multiplied read signal is filtered by a low pass filter which has a cut-off frequency Wc below w. The low pass filter provides a filtered multiplied read signal which is described by the equation $A \cdot (1-g(t))$, wherein the term $g(t)$ is the portion of $m(t)$ with frequencies below Wc. The filtered multiplied read signal is then compared to a threshold value(s) to determine a pass/fail error condition of the read signal. The certifier also has a histogram circuit which detects, counts and stores the occurrence of each peak amplitude value of the read signal. The peak amplitude data can be processed to plot a histogram which shows how many times the read signal produced various peak amplitudes. The histogram can be used to determine the actual performance of the disk certifier.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
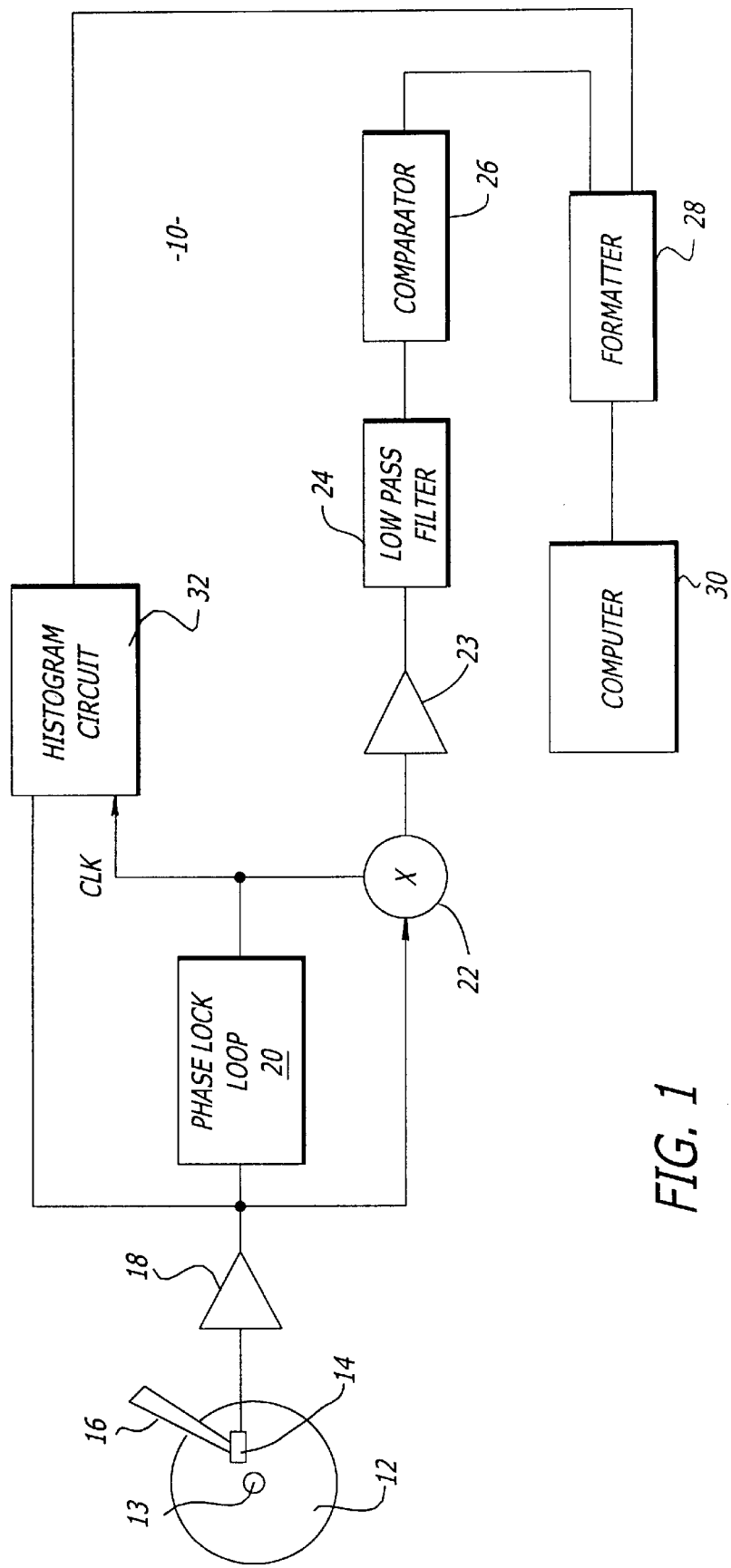
FIG. 1 is a schematic of a disk certifier of the present invention.

Referring to the drawings more particularly by reference numbers, FIG. 1 shows a disk certifier 10 of the present invention. The certifier 10 is typically utilized to measure magnetic characteristics of a magnetic disk 12. The magnetic disk 12 is typically assembled to a hard disk drive assembly (not shown). The certifier 10 contains a spindle 13 which rotates the disk 12 relative to a transducer 14 located at the end of an actuator arm 16. The transducer 14 can magnetize and sense the magnetic field of the disk 12. The disk 12 is tested by initially writing a test signal onto the disk 12. The test signal typically has a sinusoidal waveform.

After the writing sequence is completed, the certifier 10 then reads the test signal from the disk 12. The disk 12 may have imperfection which modulate the amplitude of the test signal. The read signal from the transducer can be generally described by the equation $y(t)=A \cdot \sin(wt) \cdot (1-m(t))$. Where A is the amplitude of the signal, $\sin(wt)$ is the form of the signal, and $m(t)$ is the amplitude modulation of the signal. The modulated read signal is analyzed to evaluate whether the disk 12 complies with manufacturing specifications.

The read signal is sensed by the transducer 14 and amplified by a pre-amplifier 18. The amplified read signal is provided to a phase lock loop circuit 20 and a multiplier 22. The phase lock loop circuit 20 generates an multiplier read signal that is sinusoidal in form and which is in phase with the read signal. The multiplier 22 multiplies the read signal by the multiplier read signal to provide a multiplied read signal which is described by the equation $y(t)=A \cdot \sin 2(wt) \cdot (1-m(t))$. $\sin 2(wt)$ is equal to $1-\cos 2(wt)$, wherein $y(t) = A/2 \cdot (1-\cos 2(wt)) \cdot (1-m(t))$.

The multiplied read signal is amplified by amplifier 23 and filtered by a low pass filter 24. The low pass filter 24 has a cut-off frequency Wc that is lower than the frequency w of the read signal so that the $\cos 2(wt)$ term is zero. The filtered multiplied read signal provided by the output of the low pass filter 24 is described by the equation $F(t)=A \cdot (1-g(t))$, where $g(t)$ is a portion of the modulation function that is below the cut-off frequency Wc.

The signal to noise ratio of the read signal is proportional to the bandwidth of the system's read channel. By reducing the bandwidth of the system by means of the low pass filter 24, the certifier 10 reduces the effects of noise in analyzing the disk 12. The low pass filter 24 is preferably programmable so that the end user can vary the cut-off frequency Wc. A lower cut-off frequency will increase the signal to noise ratio but will reduce the ability of the certifier to respond to fast changes in m(t). The end user can utilize the programmable filter to obtain a desired response and signal to noise ratio.

The demodulated read signal is provided to a comparator 26. The comparator 26 compares the filtered multiplied read signal with a threshold value. The threshold value is typically a constant k multiplied by an average of a predetermined number of previous peak amplitudes of the read signal, wherein k is less than 1. The comparator 26 generates an error signal if the filtered multiplied read signal is less than the threshold value. The comparator 26 preferably has a number of comparators which each have a different k value. The certifier 10 can thus provide error signals relating to different amplitude levels of the read signal.

The output(s) of the pulse detector 26 is provided to a formatter 28 that is coupled to a computer 30. The formatter 28 can correlate the error signal to specific physical locations on the disk 12 so that the end user can identify defective areas of the disk 12. The computer 30 can be utilized to further analyze and evaluate the data provided by the certifier 10.

The disk certifier 10 of the present invention may also have a histogram circuit 32 that is coupled to the transducer 14 and the phase lock loop circuit 20. The output of the phase lock loop circuit provides a clock (CLK) signal for the histogram 32. The histogram circuit 32 stores data corresponding to the peak amplitudes of the read signal generated from the disk 12. The data includes the number of occurrences that the read signal had a specific peak value. The histogram data can be accessed by the computer 30 through the formatter 28.

Figure 2:
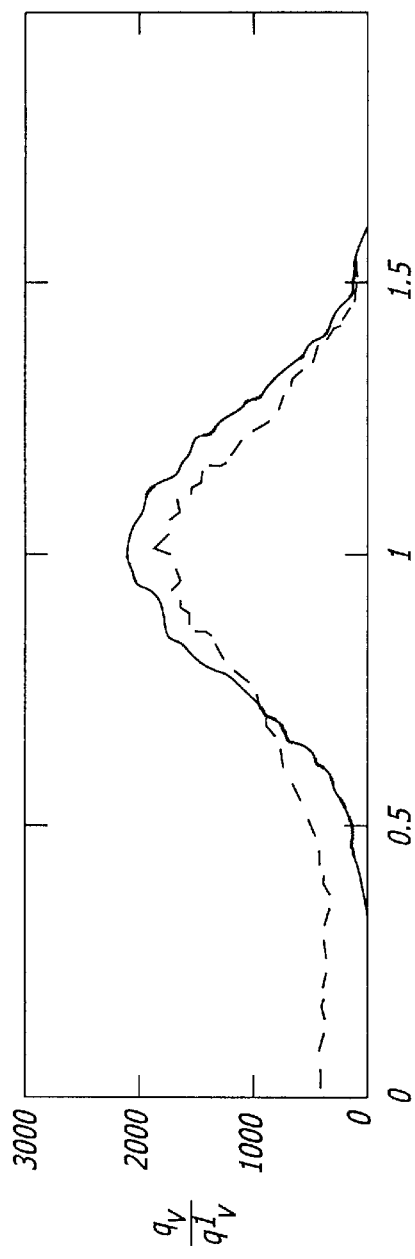
FIG. 2 is a graph showing the peak amplitude values of a read signal versus a number of samples detected at the peak amplitude.

The computer 30 can process the data stored by the histogram circuit 32 to create the curve shown in FIG. 2. The data points of the curve represent the number of times the certifier 10 detected a peak amplitude at a specified amplitude. For example, the certifier 10 may detect a peak amplitude of 0.01 volts 2000 times, a peak amplitude of 0.005 volts 20 times, and so forth and so on. For a disk 12 without defects the curve will represent the noise distribution of the system. The defect density can be computed by determining the noise, and subtracting the noise from the histographic curve. The defect density can be utilized to evaluate the disk 12 and the performance of the certifier 10.

Figure 3:
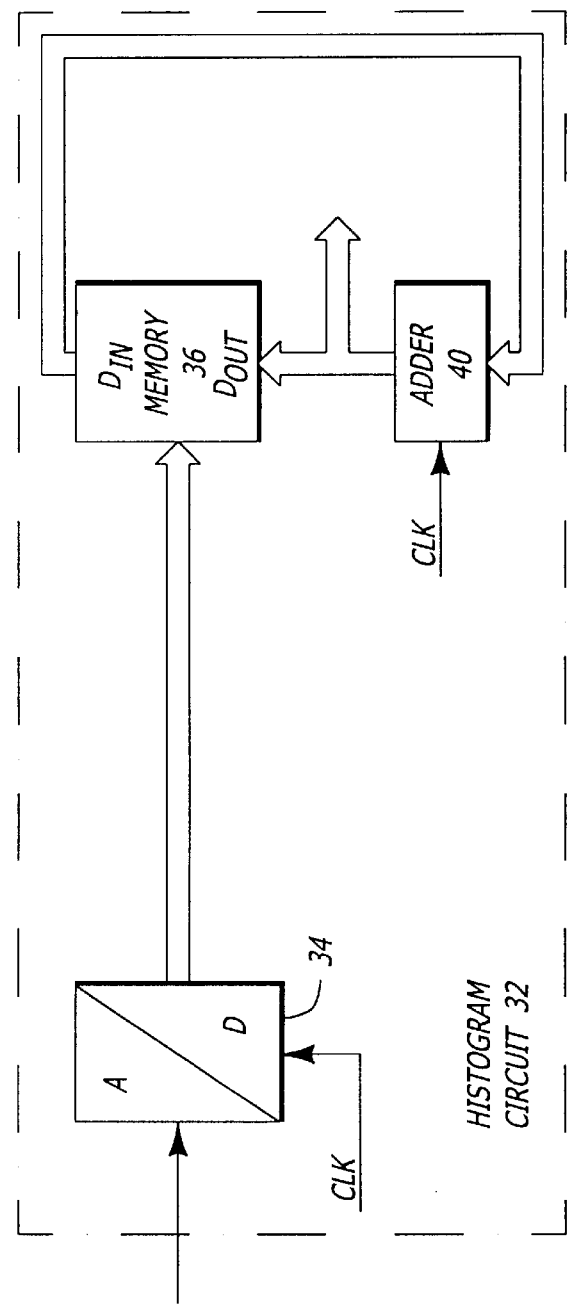
FIG. 3 is a schematic of a histogram circuit of the present invention.

FIG. 3 shows a histogram circuit 32. The circuit 32 includes an analog to digital (A/D) converter 34. The analog input of the converter 34 is connected to the transducer 14 to receive the read signal. The A/D converter 34 provides a digital output that corresponds to the peak amplitudes of the read signal. The histogram circuit 32 may receive a clock (CLK) signal from the phase lock loop circuit 20 to insure that the output of the A/D converter 34 corresponds to the peak amplitudes of the read signal.

The digital output of the A/D converter 34 is provided to a memory device 36. The memory device 36 has input $D_{in}$ and output $D_{out}$ pins that are connected to an adder 38. The adder 38 increments a present stored value of the memory device 36. The incremented value is then stored in the memory device 36 as the new present value. The contents of the memory device 38 can be accessed by the formatter 28 through the output pins $D_{out}$ of the device 36.

In operation, the read signal is provided to the A/D converter 34 which provides a digital output corresponding to a peak amplitude of the signal. The A/D converter 34 provides an output integer n which is $0<n>2^{k-1}$ where k is the number of bits of the converter 34. The integer relates to the analog input in accordance with the equation:

$$n = \left[ \frac{V_{in}}{V_{ref}} - (2^{k-1}) \right]$$

where;
Vin=the input voltage at the sample time.
Vref=a constant reference voltage.

The output of the converter 34 is applied as an address to the memory device 36. The content of the addressed memory row is incremented 1 by the adder 38 each time the row is addressed. The incremented value is then stored within the addressed row as the new present content.

By way of example, if the histogram circuit 32 had previously detected 200 occurrences of peak amplitudes having a value of 0.001 volts, a subsequent peak amplitude of 0.001 volts will increment the stored value to 201. Each peak amplitude will have an associated memory address location that contains the number of times that the read signal had such a peak amplitude. The histogram circuit 32 will therefore count the number of times the read signal had a particular peak amplitude. The computer 30 can access the data within the memory device 38 to create a histogram.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A test apparatus that analyzes a read signal generated from a disk of a hard disk drive, comprising:

a phase lock loop circuit that receives the read signal and provides a multiplier read signal;

a multiplier that multiplies the read signal by the multiplier read signal to provide a multiplied read signal;

a low pass filter that filters the multiplied read signal to provide a filtered multiplied read signal; and, a comparator that compares the filtered multiplied read signal with a threshold value to provide a pulse detection signal.

2. The test apparatus as recited in claim 1, wherein said low pass filter filters the multiplied read signal at a cut-off frequency.

3. The test apparatus as recited in claim 2, wherein said cut-off frequency is below a frequency of the read signal.

4. The test apparatus as recited in claim 1, further comprising a histogram circuit that stores a number of occurrences of an amplitude of the read signal.

5. A test apparatus that analyzes a read signal generated from a disk of a hard disk drive, wherein the read signal has a plurality of peak amplitude values, comprising:

a memory circuit that has a plurality of addressable storage locations that each contain a value that corresponds to a number of occurrences of a peak amplitude;

an adder that increments the value of an addressable storage location upon an occurrence of an additional corresponding peak amplitude;

a phase lock loop circuit that receives the read signal and provides a multiplier read signal;

a multiplier that multiplies the read signal by the multiplier read signal to provide a multiplied read signal;

a low pass filter that filters the multiplied read signal to provide a filtered multiplied read signal; and, a comparator that compares the filtered multiplied read signal with a threshold value to provide a pulse detection signal.

6. The test apparatus as recited in claim 5, wherein said adder is coupled to a data input pin and a data output pin of said memory circuit.

7. The test apparatus as recited in claim 6, further comprising an analog to digital converter which has an analog input that receives the read signal and a digital output coupled to said memory circuit.

8. The test apparatus as recited in claim 5, wherein said low pass filter filters the multiplied read signal at a cut-off frequency.

9. The test apparatus as recited in claim 8, wherein said cut-off frequency is below a frequency of the read signal.

10. The test apparatus as recited in claim 9, wherein said adder is coupled to a data input pin and a data output pin of said memory circuit.

11. The test apparatus as recited in claim 10, further comprising an analog to digital converter which has an analog input that receives the read signal and a digital output coupled to said memory circuit.

12. A method for analyzing a read signal generated from a disk of a hard disk drive, comprising the steps of:
 a) generating a multiplier read signal;
 b) multiplying the read signal by said multiplier read signal to provide a multiplied read signal;
 c) filtering said multiplied read signal to provide a filtered multiplied read signal; and,
 d) comparing said filtered multiplied read signal with a threshold value.

13. The method as recited in claim 12, wherein the read signal is filtered at a low pass cut-off frequency that is below a frequency of the read signal.

14. The method as recited in claim 12, further comprising the steps of determining a peak amplitude of the read signal and storing the peak amplitude.

* * * * *